US010248666B2

(12) United States Patent
Depalov et al.

(10) Patent No.: US 10,248,666 B2
(45) Date of Patent: Apr. 2, 2019

(54) CREATION OF HIERARCHICAL DICTIONARY

(71) Applicants: HEWLETT-PACKARD DEVELOPMENT COMPANY, L.P., Houston, TX (US); PURDUE RESEARCH FOUNDATION, West Lafayette, IN (US)

(72) Inventors: Dejan Depalov, Boise, ID (US); Peter Bauer, Boise, ID (US); Yandong Guo, West Lafayette, IN (US); Jay Allebach, West Lafayette, IN (US); Charles A. Bouman, West Lafayette, IN (US)

(73) Assignees: Hewlett-Packard Development Company, L.P., Spring, TX (US); Purdue Research Foundation, West Lafayette, IN (US)

( * ) Notice: Subject to any disclaimer, the term of this patent is extended or adjusted under 35 U.S.C. 154(b) by 607 days.

(21) Appl. No.: 14/783,106

(22) PCT Filed: Apr. 30, 2013

(86) PCT No.: PCT/US2013/038833
§ 371 (c)(1),
(2) Date: Oct. 8, 2015

(87) PCT Pub. No.: WO2014/178840
PCT Pub. Date: Nov. 6, 2014

(65) Prior Publication Data
US 2016/0070699 A1 Mar. 10, 2016

(51) Int. Cl.
G06F 17/30 (2006.01)
H03M 7/30 (2006.01)
H04N 19/90 (2014.01)

(52) U.S. Cl.
CPC .... G06F 17/3028 (2013.01); G06F 17/30327 (2013.01); G06F 17/30598 (2013.01);
(Continued)

(58) Field of Classification Search
CPC .......... G06F 17/3028; G06F 17/30327; G06F 17/30598; H04N 19/90; H03M 7/3088; H03M 7/707
(Continued)

(56) References Cited

U.S. PATENT DOCUMENTS 7,010,171 B2 3/2006 Buckley
7,317,838 B2 1/2008 Renshaw et al.
(Continued)

FOREIGN PATENT DOCUMENTS

JP 2006324714 11/2006
JP 2009188995 8/2009
(Continued)

OTHER PUBLICATIONS

Ye et al, Article: "Dictionary Design for Text Image Compression with JBIG2", IEEE Transactions on Image Processing, vol. 10, No. 6, Jun. 2001, Publisher Item Identifier S 1057-7149(01)04478-5. (Year: 2001).*
(Continued)

Primary Examiner — Evan Aspinwall
(74) Attorney, Agent, or Firm — Fabian VanCott

(57) ABSTRACT

A method of creating a hierarchical dictionary comprises, with a processor, extracting a number of symbols from a first image, constructing a number of refinement dictionary entries based on the symbols, the refinement dictionary entries forming a refinement dictionary, grouping a number of the refinement dictionary entries into clusters to form a number of refinement dictionary entry clusters, and constructing a number of direct dictionary entries for each of the
(Continued)

refinement dictionary entry clusters, the direct dictionary entries forming a direct dictionary.

15 Claims, 10 Drawing Sheets

(52) U.S. Cl.
CPC ......... *H03M 7/3088* (2013.01); *H03M 7/707* (2013.01); *H04N 19/90* (2014.11)

(58) Field of Classification Search
USPC .......................................................... 707/738
See application file for complete search history.

(56) References Cited

U.S. PATENT DOCUMENTS

| | | | |
|---|---|---|---|
| 8,081,827 B2 | 12/2011 | Gormish et al. | |
| 2003/0169934 A1* | 9/2003 | Naito | H04N 19/176 382/239 |
| 2004/0111438 A1* | 6/2004 | Chitrapura | G06F 17/30 |
| 2006/0109148 A1 | 5/2006 | Yi | |
| 2008/0175487 A1* | 7/2008 | Ohk | H04N 1/4115 382/218 |

FOREIGN PATENT DOCUMENTS

| | | |
|---|---|---|
| KR | 100717026 | 5/2007 |
| KR | 1020120093112 | 8/2012 |

OTHER PUBLICATIONS

Alegre:, M.F., Memory-efficient Algorithms for Raster Document Image Compression (Research Paper), Aug. 2010.

Hu, K. et al., MC-JBIG2: an improved algorithm for Chinese textual image compression, (Web Page), Dec. 2010, pp. 271-284, vol. 13, No. 4.

International Searching Authority, The International Search Report and the Written Opinion, dated Jan. 22, 2014, 10 pages.

Ye, Y. et al., Dictionary Design for Text Image Compression with JBIG2, (Research Paper), Jun. 2001, pp. 818-828, vol. 10, No. 6.

"Hierarchical dictionary model and dictionary management policiesfor data compression", Signal Processing, vol. .69, Jan. 1, 1998 (Jan. 1, 1998), pp. 149-155.

Yan et al: Dictionary Design for Text Image Compression with JBIG2, IEEE Transactions on Image Processing, vol. 10, No. 6, Jun. 1, 2001—11 pages.

\* cited by examiner

CREATION OF HIERARCHICAL DICTIONARY

BACKGROUND

With the exponential increase in the amount of data transferred between computing devices and storage of that data on those computing devices, image compression is a technique for reducing the amount of data that represents an image. Use of image compression assists in the rationing of space needed to store an image or the amount of computing resources and bandwidth needed to send an image.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Binary document image compression is used for document scanning, storage, and transmission. Users often desire compression of single and multi-page binary document images. Since images may be processed from consecutive pages of the same document source, there exists a higher possibility that there is information redundancy among the images within the multi-page binary document. Utilization of this type of information redundancy among images is described herein in order to improve the compression ratio for multi-page binary document image compression.

A dynamic hierarchical dictionary (HD) design for multi-page binary document image compression is described herein. Any number of image compression methods may be used in connection with the present systems and methods. One such method is the one utilized by the JBIG2 image compression standard developed by the Joint Bi-level Image Experts Group. The JBIG2 standard may be used for binary document image compression because it achieves much higher compression ratio than other facsimile encoding standards. However, although JBIG2 will be used in describing the present systems and methods, any image compression method may used in connection with the present dynamic HD.

The HD method takes advantage of the information redundancy among images of a multi-page binary document by using three methods. First, a hierarchical dictionary is built to keep more information per page for future usage. Second, the hierarchical dictionary is dynamically updated in the memory to keep as much information under a memory constraint. Third, a conditional entropy estimation technique utilizes the saved information more effectively. Experimental results presented herein demonstrate that the compression ratio improvement via the HD technique is approximately 14% compared to other techniques.

As used in the present specification and in the appended claims, the term "image" is meant to be understood broadly as any binary representation of a page of a document. The document may comprise a number of pages, and, therefore, may comprise an equal number of images.

Further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 1:
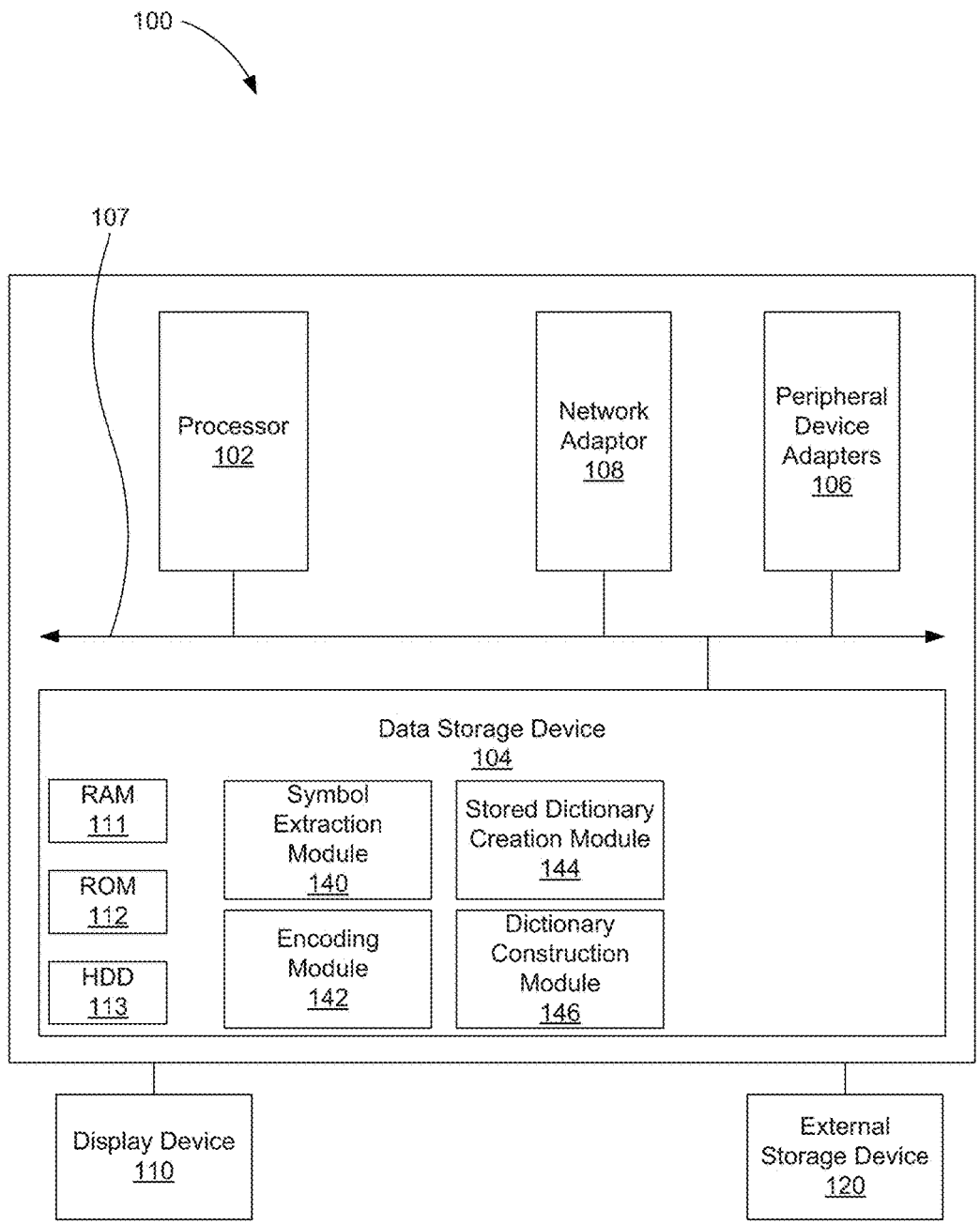
FIG. 1 is a diagram of a data processing system for creation of a number of hierarchical dictionaries for use in binary document image compression, according to one example of the principles described herein.

Turning now to the figures, FIG. 1 is a diagram of a data processing system (100) for creation of a number of hierarchical dictionaries for use in binary document image compression, according to one example of the principles described herein. The data processing system (100) may be utilized in any data processing scenario including, for example, a cloud computing service such as a Software as a Service (SaaS), a Platform as a Service (PaaS), a Infrastructure as a Service (IaaS), application program interface (API) as a service (APIaaS), other forms of network services, or combinations thereof. Further, the data processing system (100) may be used in a public cloud network, a private cloud network, a hybrid cloud network, other forms of networks, or combinations thereof. In one example, the methods provided by the data processing system (100) are provided as a service over a network by, for example, a third party. In another example, the methods provided by the data processing system (100) are executed by a local administrator.

Further, the data processing system (100) may be utilized within a single computing device. In this data processing scenario, a single computing device may utilize the hierarchical dictionary and other associated methods described herein to scan, store, and/or transmit compressed versions of single or multi-page documents.

To achieve its desired functionality, the data processing system (100) comprises various hardware components. Among these hardware components may be a number of processors (102), a number of data storage devices (104), a number of peripheral device adapters (106), and a number of network adapters (108). These hardware components may be interconnected through the use of a number of busses and/or network connections. In one example, the processor (102), data storage device (104), peripheral device adapters (106), and a network adapter (108) may be communicatively coupled via bus (107).

The processor (102) may include the hardware architecture to retrieve executable code from the data storage device (104) and execute the executable code. The executable code may, when executed by the processor (102), cause the processor (102) to implement at least the functionality of hierarchical dictionary creation and binary document image compression, according to the methods of the present specification described herein. In the course of executing code, the processor (102) may receive input from and provide output to a number of the remaining hardware units.

The data storage device (104) may store data such as executable program code that is executed by the processor (102) or other processing device. As will be discussed, the data storage device (104) may specifically store a number of applications that the processor (102) executes to implement at least the functionality described herein.

The data storage device (104) may include various types of memory modules, including volatile and nonvolatile memory. For example, the data storage device (104) of the present example includes Random Access Memory (RAM) (111), Read Only Memory (ROM) (112), and Hard Disk Drive (HDD) memory (113). Many other types of memory may also be utilized, and the present specification contemplates the use of many varying type(s) of memory in the data storage device (104) as may suit a particular application of the principles described herein. In certain examples, different types of memory in the data storage device (104) may be used for different data storage needs. For example, in certain examples the processor (102) may boot from Read Only Memory (ROM) (112), maintain nonvolatile storage in the Hard Disk Drive (HDD) memory (113), and execute program code stored in Random Access Memory (RAM) (111).

Generally, the data storage device (104) may comprise a computer readable medium, a computer readable storage medium, or a non-transitory computer readable medium, among others. For example, the data storage device (104) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. In another example, a computer readable storage medium may be any non-transitory medium that can contain, or store a program for use by or in connection with an instruction execution system, apparatus, or device.

The hardware adapters (106) in the data processing system (100) enable the processor (102) to interface with various other hardware elements, external and internal to the data processing system (100). For example, peripheral device adapters (106) may provide an interface to input/output devices, such as, for example, display device (110) or access other external devices such as an external storage device (120). The display device (110) may be provided to allow a user to interact with and implement the functionality of the data processing system (100). The peripheral device adapters (106) may also create an interface between the processor (102) and a printer, the display device (110), or other media output device. The network adapter (108) may provide an interface to other computing devices within, for example, a network, thereby enabling the transmission of data between the data processing system (100) and other devices located within the network.

The data processing system (100) further comprises a number of modules used in the creation of a number of hierarchical dictionaries and in binary document image compression. The various modules within the data processing system (100) may be executed separately. In this example, the various modules may be stored as separate computer program products. In another example, the various modules within the data processing system (100) may be combined within a number of computer program products; each computer program product comprising a number of the modules.

The data processing system (100) may comprise a symbol extraction module (140) to, when executed by the processor (102), extract a number of symbols from a number of images in a single or multi-page binary document. In one example, the symbol extraction module (140) extracts a number of individual symbols of text being approximately a 30×20 pixel image at approximately 300 dpi. In one example, the symbol extraction module (140) is stored within the data storage device (104) of the data processing system (100), and is accessible and executable by the processor (102). In another example, the symbol extraction module (140) is stored and executed on, for example, a server device via a cloud computing service for the benefit of a user of the data processing system (100) as described above.

The data processing system (100) may further comprise an encoding module (142) to, when executed by the processor (102), encode direct and refinement dictionaries, as well as encode symbols. In one example, the encoding module (142) is stored within the data storage device (104) of the data processing system (100), and is accessible and executable by the processor (102). In another example, the encoding module (142) is stored and executed on, for example, a server device via a cloud computing service for the benefit of a user of the data processing system (100) as described above.

The data processing system (100) may further comprise a stored dictionary creation module (144) to, when executed by the processor (102), create a stored dictionary comprising the union of all dictionaries from previous pages. In one example, the stored dictionary creation module (144) is stored within the data storage device (104) of the data processing system (100), and is accessible and executable by the processor (102). In another example, the stored dictionary creation module (144) is stored and executed on, for example, a server device via a cloud computing service for the benefit of a user of the data processing system (100) as described above.

The data processing system (100) may further comprise a dictionary construction module (146) to, when executed by the processor (102), construct a number of refinement and direct dictionaries. In one example, the dictionary construction module (146) is stored within the data storage device (104) of the data processing system (100), and is accessible and executable by the processor (102). In another example, the dictionary construction module (146) is stored and executed on, for example, a server device via a cloud computing service for the benefit of a user of the data processing system (100) as described above.

As mentioned above, the JBIG2 compression standard utilizes an effective method for binary image compression. Other image compression methods that may be used in connection with the present systems and methods may include, for example, T.4, T.6, and T.82 (i.e., JBIG1) as determined by the ITU Telecommunication Standardization Sector (ITU-T) or other image compression methods standardized by the ITU-T, the International Electrotechnical Commission (IEC), or the International Organization for Standardization (ISO), among other groups. The high compression ratio of JBIG2 compression comes from its dictionary symbol encoding method. A JBIG2 encoder may first separate the document into connected components, or symbols. The document may be a single or multi-page document. Further, the document may comprise text, line art, tables, and graphical elements. The JBIG2 encoder creates a dictionary by encoding a subset of the symbols from the image. All the remaining symbols are then encoded using the dictionary entries as a reference.

There are two methods to compress multipage document images using the JBIG2 encoder. The first method comprises compressing each of the pages separately and independently. This may be referred to as the IS method. The IS method does not utilize information redundancy among multiple pages within a document. Consequently, JBIG2's compression ratio is substantially lower than the present systems and methods provide, and could be substantially improved.

The other method to compress multipage document images using the JBIG2 encoder is to load all the pages in advance, and to compress all the pages together. This method can fully utilize the information redundancy among pages, but is not practical because it consumes relatively too much memory. In some circumstances, due to memory constraints, the JBIG2 encoder loads only one page or even part of one page to compress, and does not load the next page until the compression is finished. In this manner, the JBIG2 compression method does not utilize information redundancy among different pages, making it impractical in terms of memory consumption.

A dynamic hierarchical dictionary design method (HD) for multi-page binary document image compression is described herein. The present systems and methods describe how to improve the compression ratio of encoding multi-page images given a memory constraint. The present systems and methods use a hierarchical dictionary to construct additional dictionary entries for each of a number of pages within a multi-page document. Further, the present disclosure describes a dynamic dictionary updating strategy, which discards a number of "least distinct" dictionary entries when a memory constraint is met. Still further, the present systems and methods incorporate "conditional entropy" estimation strategy to measure the information redundancy between two dictionary entries. Experimental results described below demonstrate that the HD method produces a higher compression ratio relative to previous compression methods.

Some compression methods including the JBIG2 compression method allows for the retention of dictionary entries but not symbols from previous pages in a multi-page document for future use. Therefore, after a current page is encoded, a memory device may retain more dictionary entries. These additional dictionary entries may be used to encode a number of subsequent pages within the multi-page document, and, thus, a higher compression ratio can be achieved for the following pages. Construction of more dictionary entries for a single page will now be described in more detail in connection with FIGS. 2A, 2B, and 3.

Figure 2A:
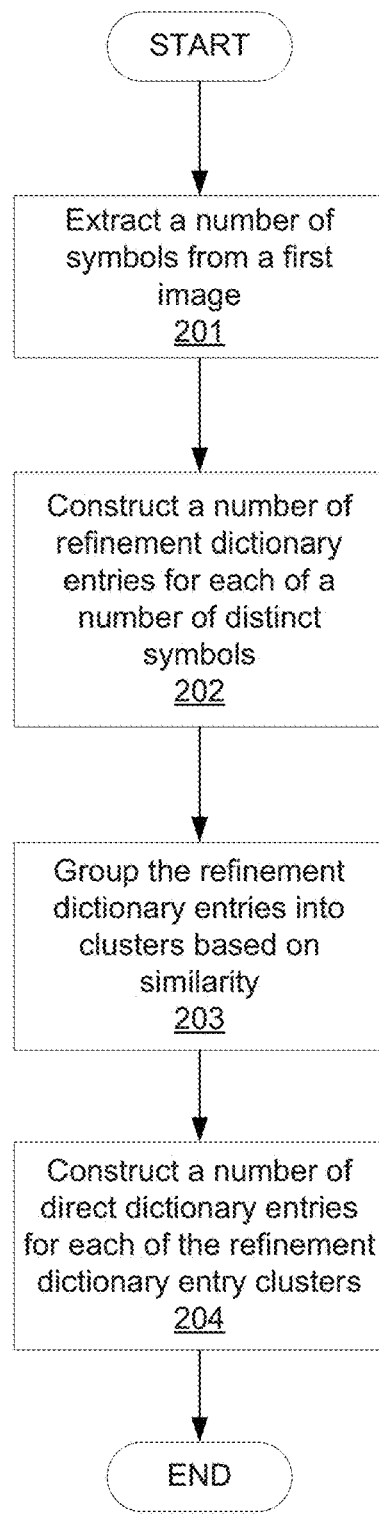
FIG. 2A is a flowchart showing a lossless hierarchical dictionary creation method, according to one example of the principles described herein.

FIG. 2A is a flowchart showing a lossless hierarchical dictionary creation method, according to one example of the principles described herein.

Figure 2B:
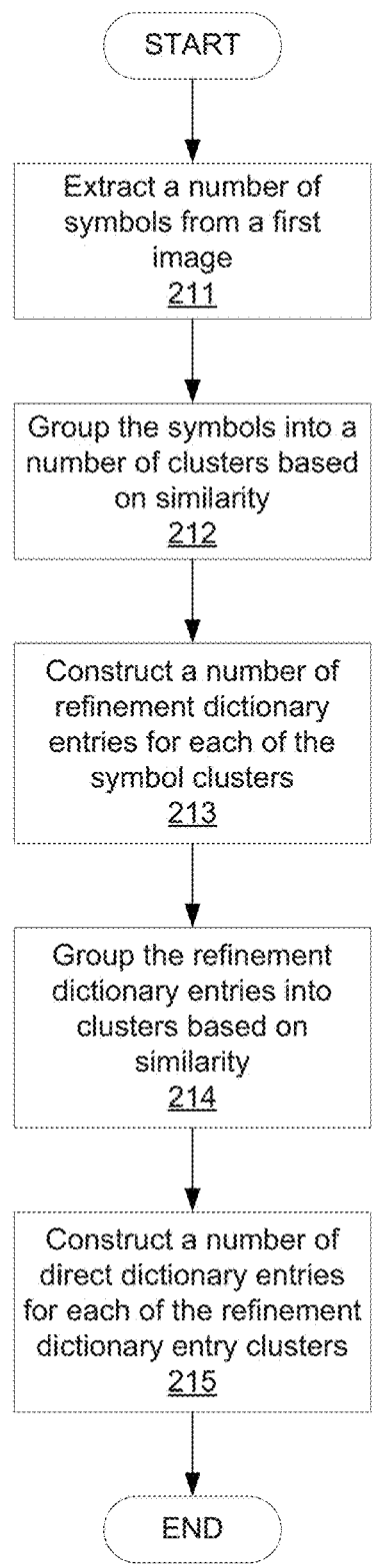
FIG. 2B is a flowchart showing a lossy hierarchical dictionary creation method, according to one example of the principles described herein.
Figure 3:
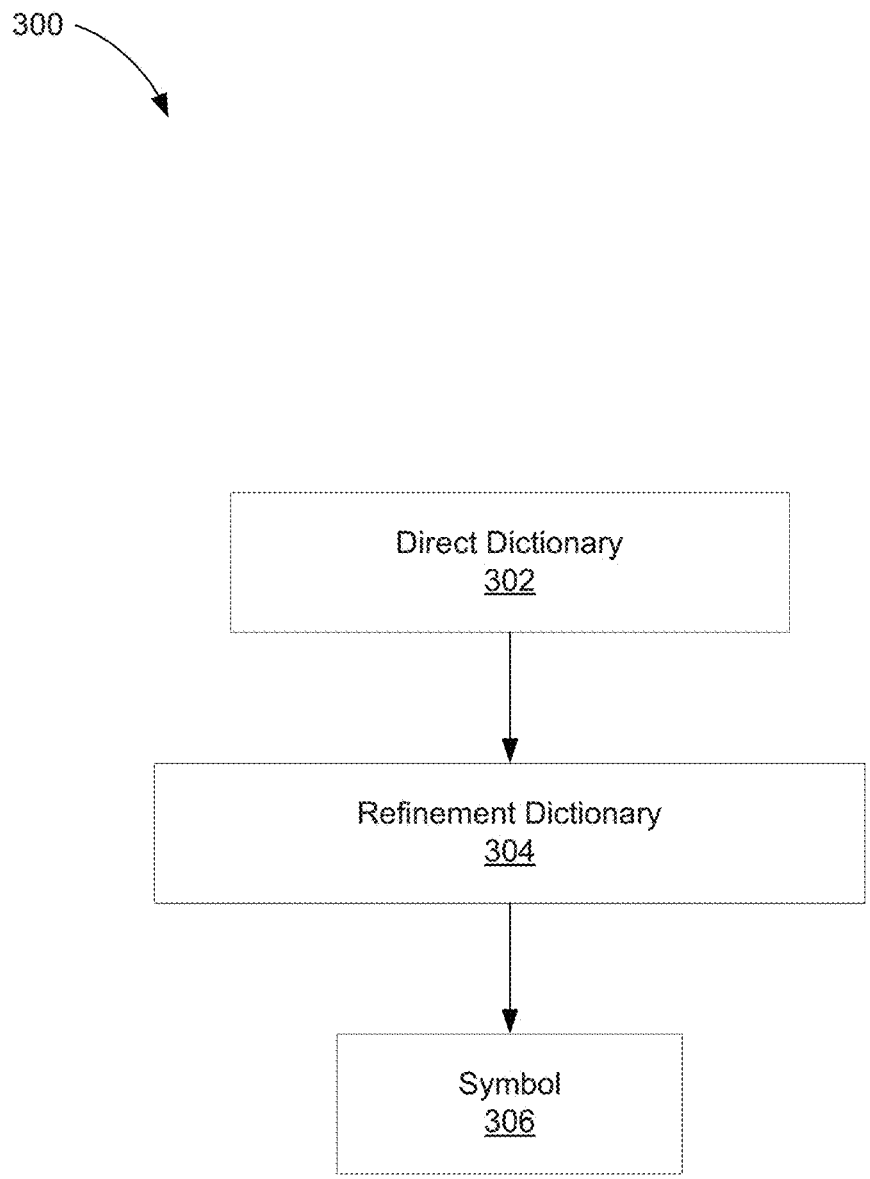
FIG. 3 is a block diagram of a hierarchical dictionary, according to one example of the principles described herein.

FIG. 2B is a flowchart showing a lossy hierarchical dictionary creation method, according to one example of the principles described herein. FIG. 3 is a block diagram of a hierarchical dictionary (300), according to one example of the principles described herein. In construction of only one dictionary for a single page, too many dictionary entries may be included within the dictionary, which, in turn, may lower the compression ratio for the single page. This is because a relatively larger amount of bits would be used to encode the dictionary itself. The present hierarchical dictionary structure may produce a large dictionary size, but with a small filesize penalty by generating a direct dictionary to encode a refinement dictionary.

In order to increase the number of dictionary entries while still providing a relatively smaller filesize penalty, the present hierarchical dictionary technique is used. The present hierarchical dictionary technique achieves this objective by creating a first dictionary to encode a second dictionary as depicted in FIGS. 2A, 2B, and 3. Again, FIG. 2A is a flowchart showing a lossless hierarchical dictionary creation method, according to one example of the principles described herein. As depicted in FIG. 2A, the processor (FIG. 1, 102), executing the symbol extraction module (140), extracts (block 201) a number of symbols (FIG. 3, 306) from a first image.

The processor, executing the encoding module (FIG. 1, 142), encodes a first dictionary that may be referred to as a direct dictionary (FIG. 3, 302). In one example, the direct dictionary (FIG. 3, 302) is encoded using the direct coding mode described in the JBIG2 standard. The processor (FIG. 1, 102), executing the encoding module (FIG. 1, 142), encodes a second dictionary, called a refinement dictionary (FIG. 3, 304), with the refinement coding mode described in the JBIG2 standard, and using the direct dictionary (FIG. 3, 302) as a reference. The refinement dictionary (FIG. 3, 304) compresses very efficiently because the refinement coding uses a reference symbol from the direct dictionary (FIG. 3, 302) to encode each new symbol in the refinement dictionary (FIG. 3, 304). All the symbols (FIG. 3, 306) in the image may then be encoded using the refinement dictionary (FIG. 3, 304) as a reference. In one example, the direct dictionary (FIG. 3, 302) is relatively smaller than the refinement dictionary (FIG. 3, 304).

In one example, any number of refinement dictionaries may be encoded. In this example, and continuing with the above description, a second refinement dictionary may be encoded with the refinement coding mode described in the JBIG2 standard, and using the refinement dictionary (FIG. 3, 304) as a reference. Likewise, a third refinement dictionary may be encoded with the refinement coding mode described in the JBIG2 standard, and using the second refinement dictionary as a reference. Thus, even though only a single direct dictionary (FIG. 3, 302) and a single refinement dictionary (FIG. 3, 304) are depicted in FIG. 3, this process of encoding of hierarchical dictionaries may be performed any number of iterations to achieve any number of hierarchical dictionaries (FIG. 3, 302, 304).

In order to construct a lossless hierarchical dictionary (300) of FIG. 3, a bottom-up procedure may be used. The method of FIG. 2A may begin by extracting (block 201) a number of symbols (FIG. 3, 306) from a first image or page. Extraction of symbols (FIG. 3, 306) may be performed by the processor (FIG. 1, 102) executing the symbol extraction module (FIG. 1, 140). The processor (FIG. 1, 102), executing the dictionary construction module (FIG. 1, 146), constructs (block 202) a number of refinement dictionary entries for each of a number of distinct symbols by duplicating the symbol's bitmap. The refinement dictionary entries form a refinement dictionary (FIG. 2, 304). By using this strategy, the bitmap information of all the symbols can be kept in memory.

The processor (FIG. 1, 102) groups (block 203) similar refinement dictionary entries into clusters, and one representative for each of the clusters is created. The representative refinement dictionary entries are the dictionary entries which form the direct dictionary. Thus, the processor (FIG. 1, 102), executing the dictionary construction module (FIG. 1, 146), constructs (block 204) a number of direct dictionary entries for each of the individual refinement dictionary entry clusters. In one example, in order to perform the clustering, a "conditional entropy" estimation-based dictionary indexing and design method may be used. This conditional entropy estimation-based dictionary indexing and design method was mentioned above, and will be described in more detail below.

FIG. 2A depicts a lossless hierarchical dictionary creation method. As mentioned above, FIG. 2B is a flowchart showing a lossy hierarchical dictionary creation method, according to one example of the principles described herein. In order to construct a lossy hierarchical dictionary (300) of FIG. 3, a bottom-up procedure may again be used. The method of FIG. 2B may begin by extracting (block 211) a number of symbols (FIG. 3, 306) from a first image or page. Extraction of symbols (FIG. 3, 306) may be performed by the processor (FIG. 1, 102) executing the symbol extraction module (FIG. 1, 140). The processor (FIG. 1, 102) groups (block 212) the symbols (FIG. 3, 306) into a number of clusters based on similarity of the symbols (FIG. 3, 306); each individual symbol cluster comprising symbols (FIG. 3, 306) that are similar.

The processor (FIG. 1, 102), executing the dictionary construction module (FIG. 1, 146), constructs (block 213) a number of refinement dictionary entries for each of the symbol clusters. The processor (FIG. 1, 102) groups (block 214) similar refinement dictionary entries into clusters, and one representative for each of the clusters is created. The representative refinement dictionary entries are the dictionary entries which form the direct dictionary. Thus, the processor (FIG. 1, 102), executing the dictionary construction module (FIG. 1, 146), constructs (block 215) a number of direct dictionary entries for each of the individual refinement dictionary entry clusters. Again, in one example, in order to perform the clustering, a "conditional entropy" estimation-based dictionary indexing and design method may be used. This conditional entropy estimation-based dictionary indexing and design method will be described in more detail below.

Figure 4A:
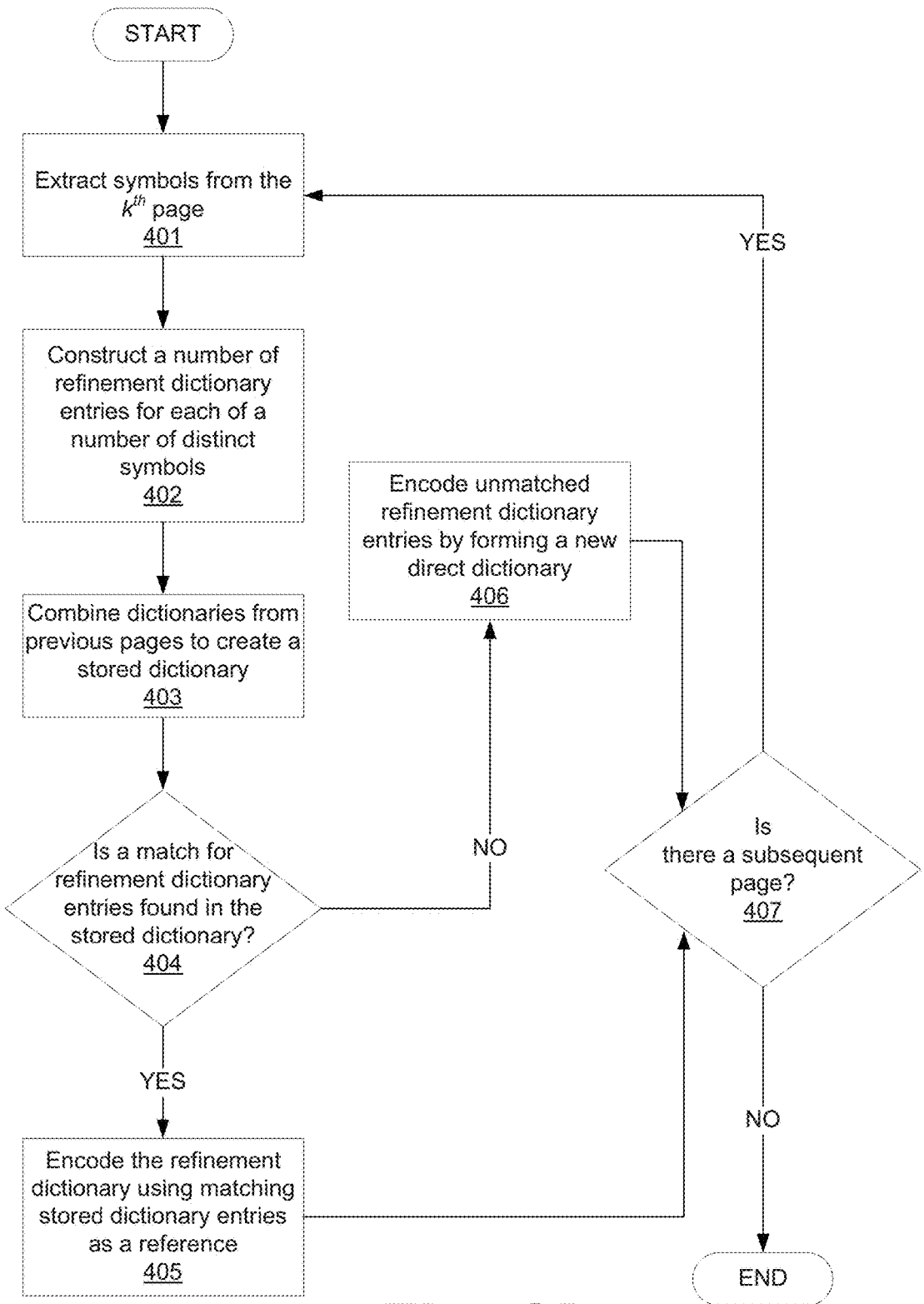
FIG. 4A is a flowchart showing a lossless hierarchical dictionary creation method for successive pages of a multi-page document, according to one example of the principles described herein.
Figure 4B:
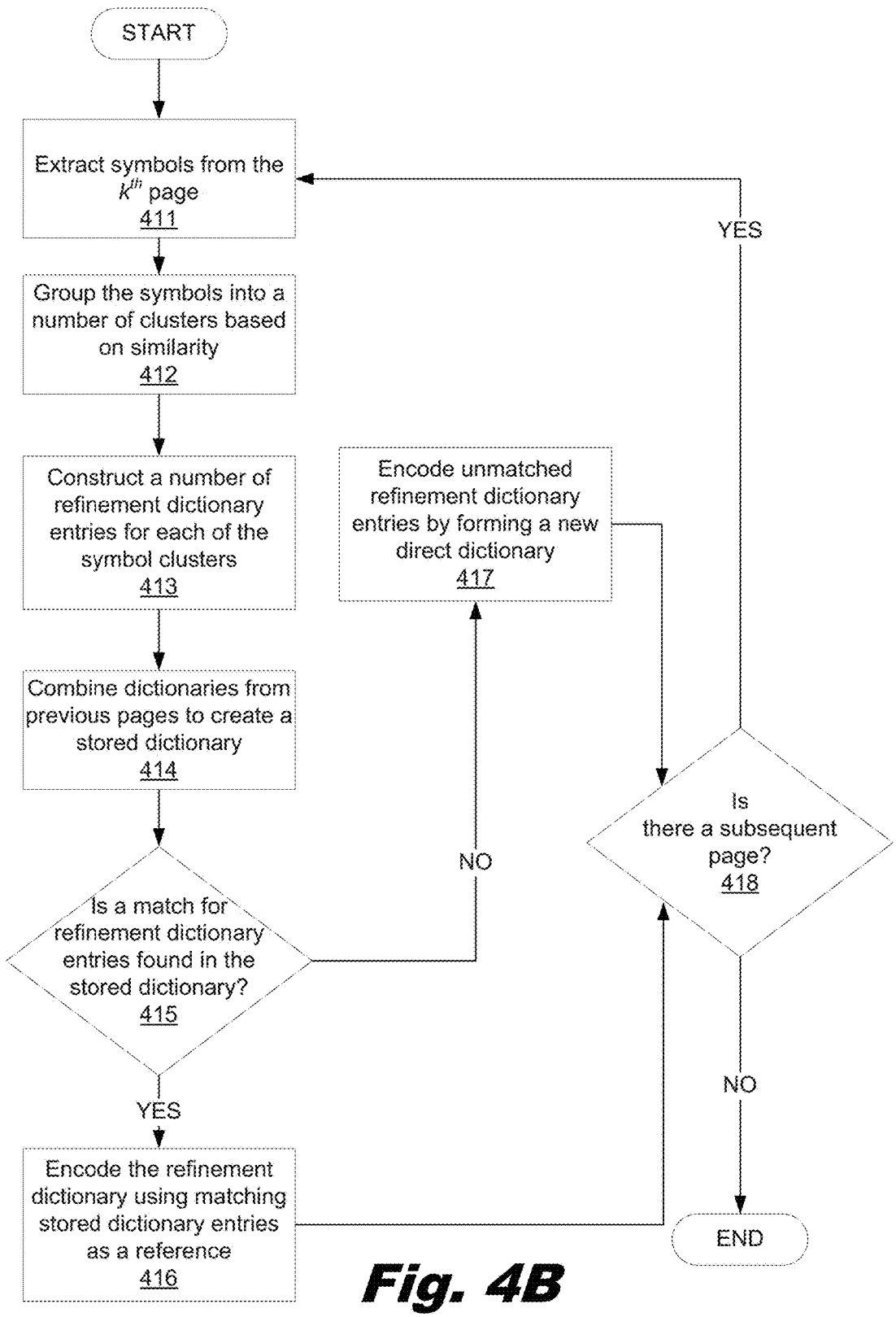
FIG. 4B is a flowchart showing a lossy hierarchical dictionary creation method for successive pages of a multi-page document, according to one example of the principles described herein.
Figure 5:
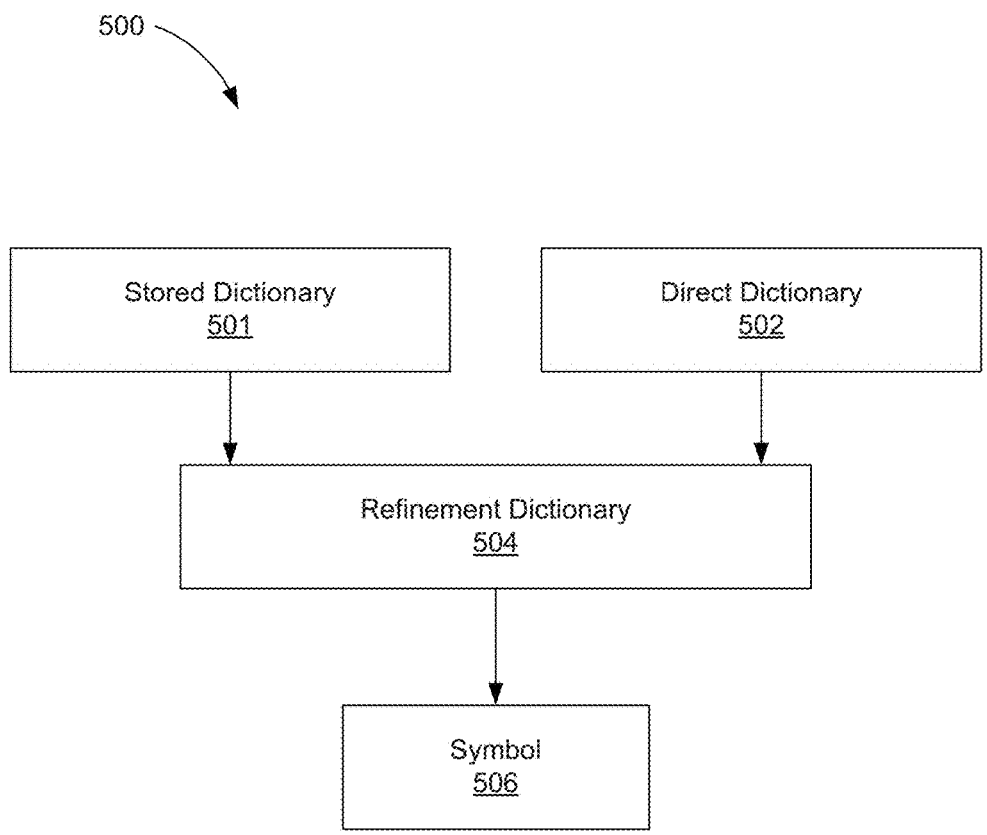
FIG. 5 is a block diagram of a hierarchical dictionary for successive pages of a multi-page document, according to one example of the principles described herein.

Encoding successive pages of a document will now be described in connection with FIGS. 4A, 4B, and 5. FIG. 4A is a flowchart showing a lossless hierarchical dictionary creation method for successive pages of a multi-page document, according to one example of the principles described herein. FIG. 4B is a flowchart showing a lossy hierarchical dictionary creation method for successive pages of a multi-page document, according to one example of the principles described herein. FIG. 5 is a block diagram of a hierarchical dictionary (500) for successive pages of a multi-page document, according to one example of the principles described herein. In some cases, a number of pages may exist within a single document. In these multi-page binary documents, there exists a higher possibility that there is information redundancy among the images or pages within the multi-page document where utilization of this type of information redundancy among images improves the compression ratio for multi-page binary document image compression. Thus, for successive pages within a multi-page document, a stored dictionary (FIG. 5, 501), denoted as $D_k^S$, is used for the $k^{th}$ page where k≠1. The lossless hierarchical dictionary creation method of FIG. 4A may begin by the processor (FIG. 1, 102), executing the symbol extraction module (140), extracting (block 401) a number of symbols (FIG. 5, 506) from a $k^{th}$ page of the multi-page document. Again, the $k^{th}$ page of the multi-page document is not the first page of the multi-page document, but is any number of subsequent pages thereafter. The processor (FIG. 1, 102), executing the dictionary construction module (FIG. 1, 146), constructs (block 402) a number of refinement dictionary entries for each of a number of distinct symbols to form a refinement dictionary (FIG. 5, 504).

A stored dictionary (FIG. 5, 501) is created (block 403) by the processor (FIG. 1, 102) executing the stored dictionary creation module (FIG. 1, 144) by combining refinement (FIG. 504) and direct (FIG. 5, 502) dictionaries created from previous pages within the multi-page document. When there is no memory constraint imposed within the system (100), the stored dictionary (FIG. 5, 501), $D_k^S$, comprises the union of all dictionaries from previous pages. The stored dictionary (FIG. 5, 501) is the pruned union of all the dictionaries from previous pages of the multi-page document. A situation where a memory constraint is imposed on the system (FIG. 1, 100) will be described in more detail below.

Thus, the refinement dictionary (FIG. 5, 504), $D_k^r$, is formed (block 403) by the processor, executing the encoding module (FIGS. 1, 142), and including every unique symbol in the $k^{th}$ page as entries in the refinement dictionary (FIG. 5, 504). The method of FIG. 4A may continue by determining (block 404) if a match for the refinement dictionary entries are found in the stored dictionary (FIG. 5, 501). For each of the given refinement dictionary entries, a match may be found (block 404, Determination YES) in the stored dictionary, $D_k^S$, to encode (block 405) the refinement dictionary efficiently. The processor (FIG. 1, 102), executing the encoding module (FIG. 1, 142), encodes (block 405) using the matching stored dictionary entries as a reference. In most cases, the entries in the refinement dictionary (FIG. 5, 504) will have a good match in the stored dictionary (FIG. 5, 501). Thus, in these cases, the refinement dictionary (FIG. 5, 504) is encoded very efficiently.

However, in some instances, there may exist refinement dictionary entries that do not have a good match in the stored dictionary (FIG. 5, 501) (block 404, Determination NO). In order to encode these unmatched refinement dictionary entries, the processor (FIG. 1, 102), executing the encoding module (142), forms (block 406) a new direct dictionary (FIG. 5, 502) denoted by $D_k$. As similarly described above, the direct dictionary (FIG. 5, 502) is built using the conditional entropy estimation-based dictionary indexing and design method. The conditional entropy estimation-based dictionary indexing and design method assists in determining whether a good match for a given refinement dictionary entry may be found in the stored dictionary (FIG. 5, 501). Thus, some entries in the refinement dictionary (FIG. 5, 504) are encoded using the stored dictionary (FIG. 5, 501), while the rest are encoded using the direct dictionary (FIG. 5, 502). All the symbols (FIG. 5, 506) in the image of the $k^{th}$ page of the multi-page document may then be encoded using the refinement dictionary (FIG. 5, 504) as a reference.

The above example process may continue by determining (block 407), with the processor, if there are subsequent pages in the multi-page document to be analyzed. If there is a subsequent page in the document to be analyzed (block 407, Determination YES), then the process may loop back to block 401, and the stored dictionary (FIG. 5, 501) may be recreated for the new, subsequent page. If there is not a subsequent page in the document to be analyzed (block 407, Determination NO), then the process may terminate.

Having described a lossless hierarchical dictionary creation method in FIG. 4A, a lossy hierarchical dictionary creation method will now be described. Again, FIG. 4B is a flowchart showing a lossy hierarchical dictionary creation method for successive pages of a multi-page document, according to one example of the principles described herein.

The lossy hierarchical dictionary creation method of FIG. 4A may begin by the processor (FIG. 1, 102), executing the symbol extraction module (140), extracting (block 411) a number of symbols (FIG. 5, 506) from a $k^{th}$ page of the multi-page document. Again, the $k^{th}$ page of the multi-page document is not the first page of the multi-page document, but is any number of subsequent pages thereafter. The processor (FIG. 1, 102) groups (block 412) the symbols (FIG. 5, 506) into a number of clusters based on similarity. The resultant symbol clusters each individually comprise symbols that are similar. The processor (FIG. 1, 102), executing the dictionary construction module (FIG. 1, 146), constructs (block 413) a number of refinement dictionary entries for each of the symbol clusters to form a refinement dictionary (FIG. 5, 504).

A stored dictionary (FIG. 5, 501) is created (block 414) by the processor (FIG. 1, 102) executing the stored dictionary creation module (FIG. 1, 144) by combining refinement (FIG. 504) and direct (FIG. 5, 502) dictionaries created from previous pages within the multi-page document. Again, when there is no memory constraint imposed within the system (100), the stored dictionary (FIG. 5, 501), $D_k^S$, comprises the union of all dictionaries from previous pages. The stored dictionary (FIG. 5, 501) is the pruned union of all the dictionaries from previous pages of the multi-page document. A situation where a memory constraint is imposed on the system (FIG. 1, 100) will be described in more detail below.

The method of FIG. 4B may continue by determining (block 415) if a match for the refinement dictionary entries are found in the stored dictionary (FIG. 5, 501). For each of the given refinement dictionary entries, a match may be found (block 415, Determination YES) in the stored dictionary, $D_k^S$ to encode (block 416) the refinement dictionary efficiently. The processor (FIG. 1, 102), executing the encoding module (FIG. 1, 142), encodes (block 416) using the matching stored dictionary entries as a reference. In most cases, the entries in the refinement dictionary (FIG. 5, 504) will have a good match in the stored dictionary (FIG. 5, 501). Thus, in these cases, the refinement dictionary (FIG. 5, 504) is encoded very efficiently.

However, in some instances, there may exist refinement dictionary entries that do not have a good match in the stored dictionary (FIG. 5, 501) (block 415, Determination NO). In order to encode these unmatched refinement dictionary entries, the processor (FIG. 1, 102), executing the encoding module (142), forms (block 417) a new direct dictionary (FIG. 5, 502) denoted by $D_k$. As similarly described above, the direct dictionary (FIG. 5, 502) is built using the conditional entropy estimation-based dictionary indexing and design method. The conditional entropy estimation-based dictionary indexing and design method assists in determining whether a good match for a given refinement dictionary entry may be found in the stored dictionary (FIG. 5, 501). Thus, some entries in the refinement dictionary (FIG. 5, 504) are encoded using the stored dictionary (FIG. 5, 501), while the rest are encoded using the direct dictionary (FIG. 5, 502). All the symbols (FIG. 5, 506) in the image of the $k^{th}$ page of the multi-page document may then be encoded using the refinement dictionary (FIG. 5, 504) as a reference.

The above example process may continue by determining (block 418), with the processor, if there are subsequent pages in the multi-page document to be analyzed. If there is a subsequent page in the document to be analyzed (block 418, Determination YES), then the process may loop back to block 401, and the stored dictionary (FIG. 5, 501) may be recreated for the new, subsequent page. If there is not a subsequent page in the document to be analyzed (block 418, Determination NO), then the process may terminate.

The criteria to determine whether a good match for the given refinement dictionary entry may be found in the stored dictionary (FIG. 5, 501) is based on the conditional entropy estimation (CEE). Let $d_{k,j}^r$ denote the $j^{th}$ entry in $D_k^r$, and $d_{k,i}^s$ denote the $i^{th}$ entry in $D_k^s$. The best match for $d_{k,j}^r$ in $D_k^s$ is found by:

$$d^* = \arg\min \hat{H}(d_{k,j}^r | d_{k,i}^s), \; d_{k,i}^s \in D_k^s \qquad \text{Eq. 1}$$

where $\hat{H}(d_{k,j}^r | d_{k,i}^s)$ is the estimation of the conditional entropy of $d_{k,j}^r$ given $d_{k,i}^s$. If the conditional entropy of $d_{k,j}^r$ given $d^*$ is smaller than the predefined threshold $T_R$, $$\hat{H}(d_{k,j}^r | d^*) \leq T_R \qquad \text{Eq. 2}$$

$d_{k,j}^r$ is encoded using the stored dictionary entry $d^*$ as a reference. Otherwise, $d_{k,j}^r$ is not encoded using the stored dictionary (FIG. 5, 501). Thus, if $$\hat{H}(d_{k,j}^r | d^*) > T_R \qquad \text{Eq. 3}$$

a new direct dictionary entry for $d_{k,j}^r$ is created. In one example, the conditional entropy $\hat{H}(d_{k,j}^r | d^*)$ may be substituted with other functions such as, for example, XOR or WXOR to reduce the computational cost at the cost of lower compression ratio.

In order to make the above methods practical, the size of the stored dictionary (FIG. 5, 501) may be maintained so as to not grow beyond an available memory size, as mentioned above. The method used in a scenario where a memory constraint is imposed within the system (100) is to discard some of the stored dictionary entries whenever the memory size for all the dictionaries (FIG. 5, 501, 502, 504) for the $k^{th}$ page is larger than 1 Mb. The threshold value is chosen to be 1 Mb because the standard is a decoder that has at least a 1 Mb of storage for the dictionaries (FIG. 5, 501, 502, 504). However, any threshold value of memory size for all the dictionaries (FIG. 5, 501, 502, 504) may be used, and may be user-definable.

In one example, the memory size for the dictionaries all the dictionaries (FIG. 5, 501, 502, 504) for the $k^{th}$ page is the summation of the memory size for $D_k$, $D_k^r$, and $D_k^s$, which can be calculated using the following. Let MSD be the memory size (in bytes) of the symbol dictionary, and equals a fixed component plus a per-symbol component. The fixed component equals 2^(direct coding template size_plus 2^(refinement coding template size)+8 K. The per-symbol component equals the following:

$$\sum_{i=1}^{N} \frac{32 + R(w(i) \times h(i))}{8} \qquad \text{Eq. 4}$$

where w(i) is the symbol width, and h(i) is the symbols height. There is a 32 byte per symbol overhead In the above examples, the entry to be discarded is the stored dictionary entry $d_{k,\hat{m}}^S$ satisfying both of the following two conditions: (1) the entry $d_{k,\hat{m}}^S$ is not referred by any entry in $D_k^r$; and (2) the entry $d_{k,\hat{m}}^S$ is "least distinct," least distinct being defined as $$\hat{m} = \operatorname*{argmin}_{m} d_{XOR}(d_{k,m}^S, d_{k,n}) \qquad \text{Eq. 5}$$

where $d_{k,n}$ is any dictionary entry different from $d_{k,\hat{m}}^S$, and that belongs to $D_k$, $D_k^r$, or $D_k^s$. The function $d_{XOR}$ calculates the Hamming distance between two dictionary entries. Similar dictionary entries may have more mutual information. Therefore, by using the above strategy as much total information as possible is maintained in memory under the memory size constraint.

The above methods may continue by transmitting or storing the hierarchical dictionary (300, 500) along with the symbols (306, 506) for later processing. This later processing may include the decoding of the hierarchical dictionary (300, 500) and the symbols (306, 506) in order to recreate a lossless or lossy version of the original image or images within the document.

An example of the method of FIG. 2 may be given by the following experimental result. A test image, image01.pbm, is scanned at 300 dpi and has a size of 3275×2525 pixels is compressed. A XOR-based one-pass algorithm (OP-XOR) is used to compress image01.pbm for 15 times, each time with different dictionary sizes. The different dictionary sizes are obtained by specifying different parameter values for OP-XOR. When one dictionary entry is created for each of the distinct symbols in image01.pbm, the number of the dictionary entries is maximized at 2208. In this case, the bitstream filesize is 44.75 KB.

One entry in the refinement dictionary is constructed for each of the distinct symbols by duplicating each of the symbols' bitmaps. The bitmap information of all the symbols may be stored in a data storage device such as the data storage device (104) or external storage device (120) of the data processing system (100). The dictionary entries in the refinement dictionary are treated as symbols, and the direct dictionary for the refinement dictionary entries is constructed using OP-XOR, OP-WXOR, or a conditional entropy estimation (CEE) distance measure method.

The result using hierarchical structure to encode image01.pbm is shown in FIG. 2. Using the hierarchical OPXOR algorithm, 2208 dictionary entries are obtained with a bitstream filesize of 31:20 KB, which is much smaller than 44:75 KB obtained by OP-XOR without hierarchical structure. Using the hierarchical CEE algorithm, 2208 dictionary entries are also obtained, and the bitstream filesize is 26:85 KB. Compared to the case with the CEE algorithm without hierarchical structure, 393:96% more dictionary entries are obtained at the cost of 1:45 KB filesize increase.

However, adjusting the parameter of OP-XOR, it is determined that with the dictionary of 438 entries, the bitstream filesize is only 28.11 KB. A conditional entropy estimation (CEE) distance measure, explained below, is used to compress image01.pbm. Though the CEE distance measure needs no parameter specified and produces smaller bitstream filesize, 25.40 KB, the CEE distance measure only generates 447 dictionary entries, which is much less than the expected 2208 dictionary entries. Thus, without using the hierarchical dictionary method described above, a large dictionary is obtained at the cost of almost doubling the filesize. With the hierarchical dictionary method, a large dictionary with small filesize penalty is obtained.

A comparison of the present dynamic hierarchical dictionary (HD) method with other methods will now be described in order to demonstrate experimentally the advantages of the present systems and methods. The DSC method in the below experiments is based on a weighted Hamming distance (WXOR) for the dissimilarity measurement between symbols and dictionary entries. For the present dynamic HD method, two versions of the DSC method are used. The first one is described above, and may be referred to as DH-CEE, since it uses the conditional entropy estimation (CEE) symbol distance. The second versions of the two DSC methods used in connection with these experiments substitutes the CEE dissimilarity measure with the WXOR dissimilarity measure, in order to see the benefit due only to the present dynamic hierarchical dictionary method. This method may be referred to as the HD-WXOR method.

The test image set may be referred to as EEPaper, and contains 9 images scanned from consecutive pages of the same document. All of these images are 300 dpi with 3275×2525 pixels. The test images include mostly text, but some of the images also include line art, tables, and graphical elements. However, none of the test images within EEPaper include halftones. The JBIG2 lossless text mode is used for all experiments. The threshold total memory usage for the dictionaries is limited to be less than 1 MB. Unless otherwise stated, the parameters of all the methods are adjusted so that each of the methods achieve their optimal compression ratios.

Figure 6:
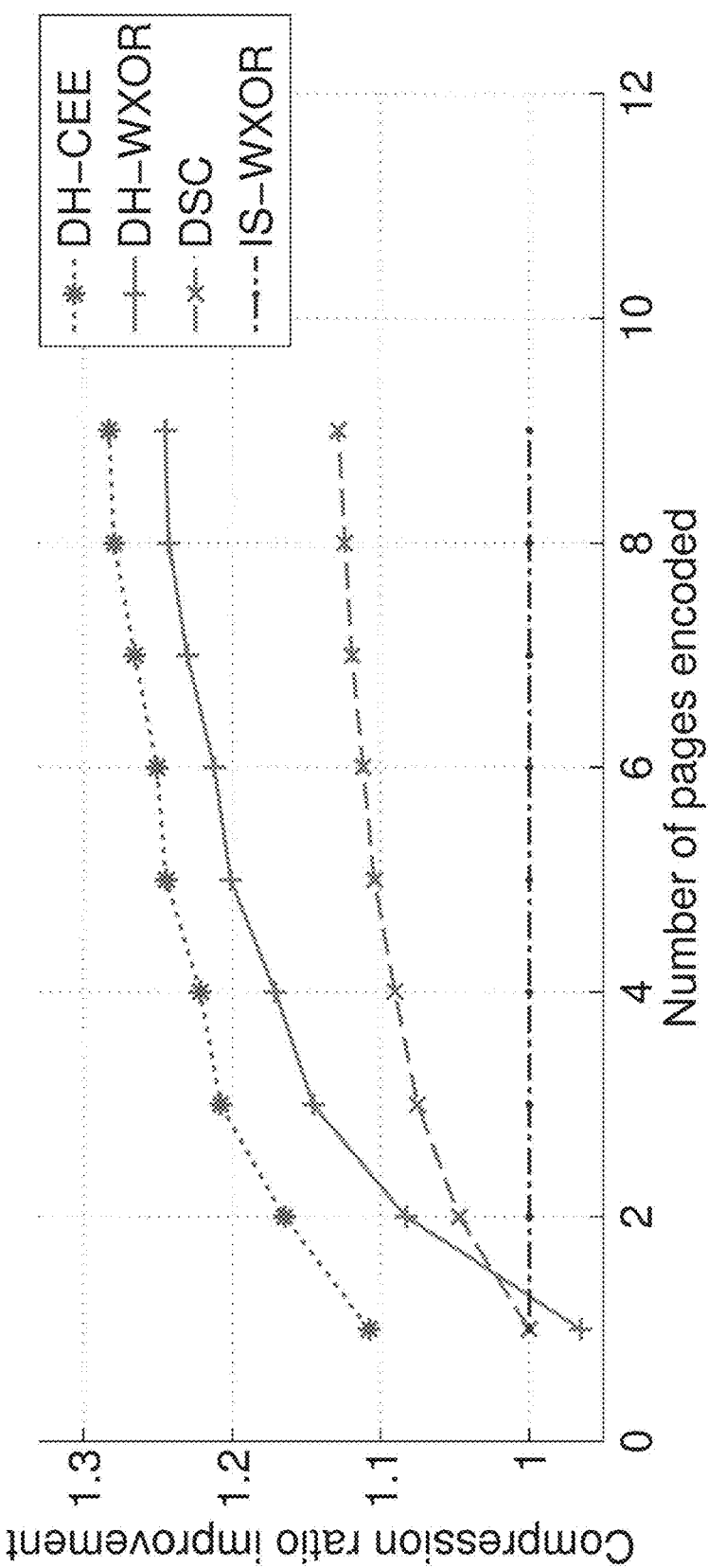
FIG. 6 is a graph depicting compression ratio improvements by a number of compression methods relative to the IS-WXOR, according to one example of the principles described herein.

In the following experiment, the entire test image set is compressed. FIG. 6 is a graph depicting compression ratio improvements by a number of compression methods relative to the IS-WXOR, according to one example of the principles described herein. FIG. 6 depicts a comparison of the DH-CEE method to the alternative methods. In the graph of FIG. 6, everything is relative to the independent and static dictionary constructed with the WXOR dissimilarity measure (IS-WXOR). It is noted that the DH-CEE method has the highest compression ratio for all the pages. For the entire test image set, DH-CEE improved the compression ratio by 28% compared to IS-WXOR, and 14% compared to DSC.

Figures 7A, 7B:
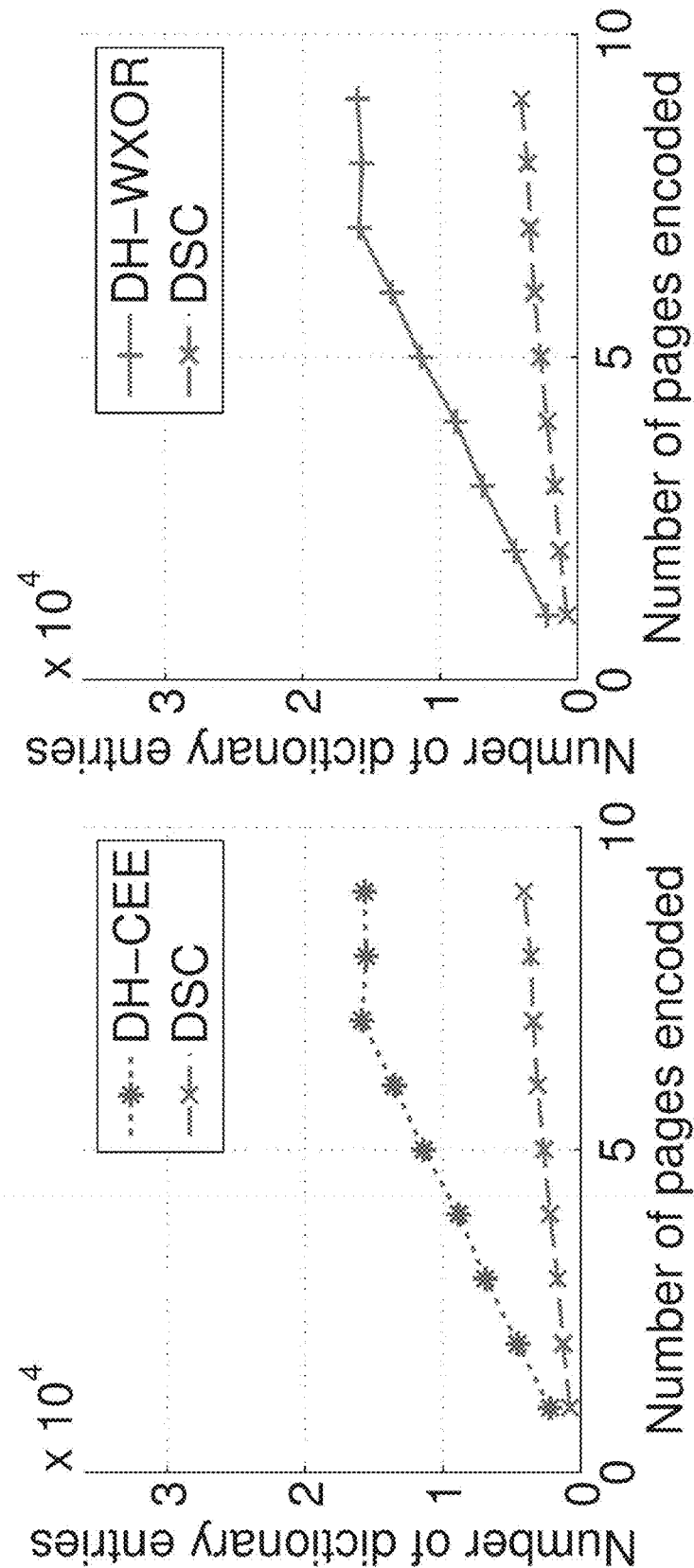
FIGS. 7A and 7B are graphs depicting the number of dictionary entries obtained by a number of dictionary design methods, according to one example of the principles described herein.

One reason for the compression ratio improvement by DH-CEE over DSC is that DH-CEE produces a much larger dictionary for each of the pages. FIGS. 7A and 7B are graphs depicting the number of dictionary entries obtained by a number of dictionary design methods, according to one example of the principles described herein. As depicted in FIGS. 7A and 7B, the larger dictionaries can more efficiently encode the documents or images. The large dictionaries produced by the DH methods encode the documents efficiently. For DH-CEE and DH-WXOR, the dynamic updating controls the size of their dictionaries after the 7th page of the 9-page test document due to the memory constraint. However, in using DH-CEE, only a small overhead is needed to encode the large dictionary. The efficient encoding of large dictionaries is demonstrated with an example below.

In a next example, the DH method is demonstrated as allowing for the encoding of a large dictionary with a relatively little overhead using the following experiment. The DH-CEE and DSC methods were used to create large dictionaries for the first page in EEPaper, and these large dictionaries are compared in terms of the numbers of bits they used to encode their dictionaries.

Figure 8:
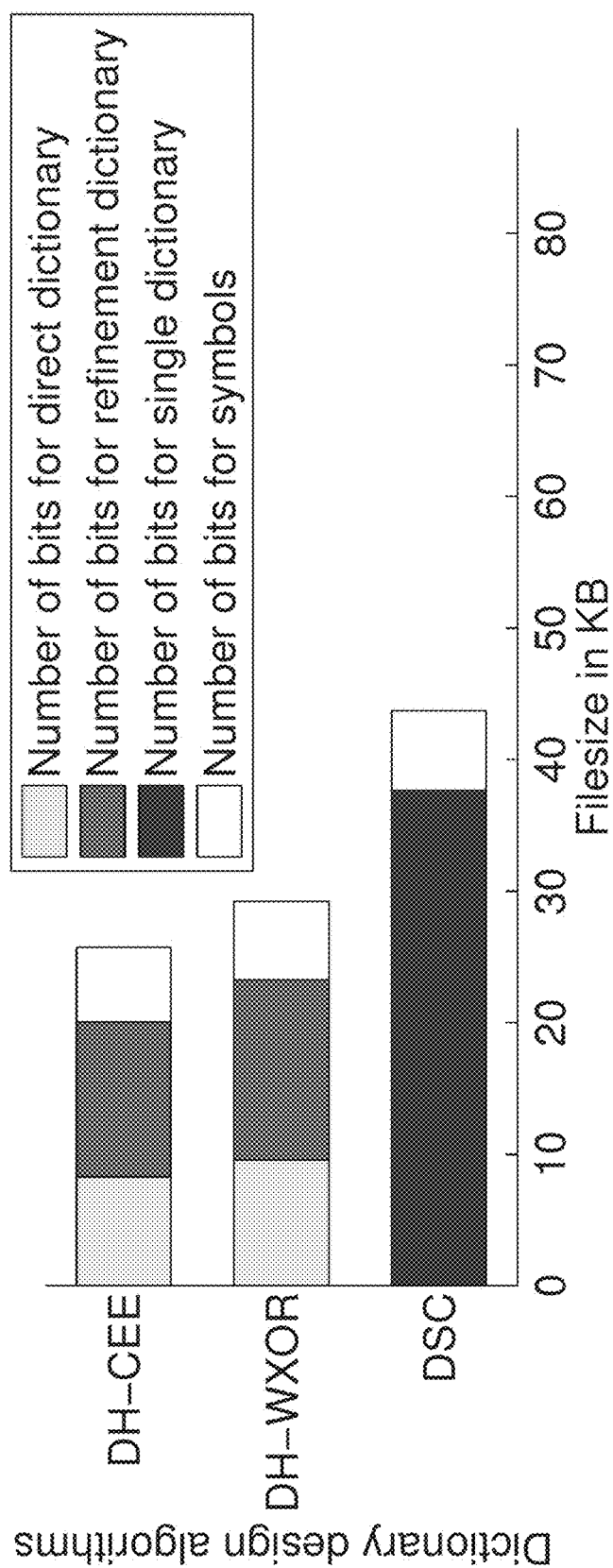
FIG. 8 is a graph depicting a comparison of bit rate using three methods of dictionary compression, according to one example of the principles described herein.

The refinement dictionary produced by the DH-CEE method is large in size because DH-CEE creates one refinement dictionary entry for each of the distinct symbols in a page. For the DSC method, its parameters are adjusted to obtain a single dictionary, which is as large as the refinement dictionary with DH-CEE. FIG. 8 is a graph depicting a comparison of bit rate using three methods of dictionary compression, according to one example of the principles described herein. As depicted in FIG. 8, the bitstream filesize obtained by using DH-CEE is significantly smaller than that obtained with DSC. This is due to the hierarchical structure of DH-CEE. DH-CEE builds up the direct dictionary using CEE-ID to encode the refinement dictionary efficiently. It is also noted that DH-CEE results in the smallest encoded dictionary.

The compression ratio improvement by DH-CEE also comes from the conditional entropy estimation (CEE). For comparison, the DH-WXOR method is investigated, which substitutes CEE with WXOR. First, the single page experiment described above in connection with the method of FIG. 2 is repeated with the DH-WXOR method. The refinement dictionaries obtained by using DH-WXOR and DH-CEE are identical since they used the same method to create their refinement dictionaries. As shown in FIG. 8, the bit rate obtained by using DH-WXOR is smaller than that with DSC because of the hierarchical dictionary design. One the other hand, the bit rate with DH-WXOR is larger than that of DH-CEE. This is because CEE used in DH-CEE provides better measurement for the information redundancy between dictionary entries than WXOR in DH-WXOR. Thus, DH-CEE creates a better direct dictionary to encode the refinement dictionary.

The multi-page experiment described above in connection with EEPaper with the DH-WXOR method is repeated. As shown in FIG. 6, DH-WXOR improved the compression ratio by 11% compared to DSC. This improvement comes from the large dictionaries produced by the dynamic hierarchical design of DH-WXOR, depicted in FIG. 7B. On the other hand, the compression ratio with DH-WXOR is about 4% less than that of DH-CEE. This is because, based on CEE, DH-CEE creates better direct dictionaries and selects better stored dictionary entries to encode the refinement dictionary in connection with Eq. 1 than the DH-WXOR method.

It is noted that all the above experiments were conducted subject to the 1 MB memory constraint. As shown in FIG. 7A, the dynamic updating continued discarding stored dictionary entries since the 7th page was encoded. If the memory constraint were released, no dictionary entries would be discarded, and extra memory would be consumed. However, according to the above experimental results, the extra memory usage only improves the compression ratio by less than 1%. This is because the dynamic updating minimizes the information loss caused by discarded dictionary entries by selecting the least distinct stored dictionary entries.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (102) of the data processing system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe systems and methods for creation of a hierarchical dictionary for image compression. The methods may comprise extracting a number of symbols from a first image, constructing a number of refinement dictionary entries based on the symbols, the refinement dictionary entries forming a refinement dictionary, grouping a number of the refinement dictionary entries into clusters to form a number of refinement dictionary entry clusters, and constructing a number of direct dictionary entries for each of the refinement dictionary entry clusters, the direct dictionary entries forming a direct dictionary. These systems and methods may have a number of advantages, including: (1) creating a lossless system where no information is lost in compression and reconstruction; (2) providing a more efficient storage of large dictionaries that more efficiently encode symbols within a document; (3) providing further improvements to encoding efficiency of dictionary design and encoding process through use of conditional entropy estimation; and (4) improves the encoding efficiency by maintaining and utilizing the information from previous pages to encode the successive pages. The present dynamic hierarchical dictionary (HD) design method for the multi-page binary document image compression improves encoding efficiency by maintaining and utilizing the information from previous pages to encode the successive pages. The HD method outperforms other methods using the following technologies. First, hierarchical design allows more information per page to be maintained. Second, the dynamic updating assists in maintaining as much information as possible subject to the memory size constraint. Third, the conditional entropy estimation assists in utilizing the maintained information more efficiently.

The preceding description has been presented to illustrate and describe examples of the principles described. This description is not intended to be exhaustive or to limit these principles to any precise form disclosed. Many modifications and variations are possible in light of the above teaching.

What is claimed is:
1. A method of creating a hierarchical dictionary comprising, with a processor:
    extracting, by a processor, a plurality of symbols from a first image;

constructing, by the processor, a plurality of refinement dictionary entries based on the symbols, the plurality of refinement dictionary entries forming a refinement dictionary;

grouping, by the processor, the plurality of refinement dictionary entries into clusters to form a plurality of refinement dictionary entry clusters;

constructing, by the processor, a plurality of direct dictionary entries for each of the refinement dictionary entry clusters, the plurality of direct dictionary entries forming a direct dictionary, wherein the direct dictionary is formed by encoding unmatched refinement dictionary entries using the refinement dictionary;

constructing, by the processor, a stored dictionary by combining the refinement dictionary and the direct dictionary, wherein the refinement dictionary and the direct dictionary are created from a plurality of previous images before a subsequent image;

creating, by the processor, additional dictionary entries for each page within a multi-page document resulting in a larger dictionary for each page;

measuring, by the processor, information redundancy between the dictionary entries; and combining, by the processor, the direct dictionary, the refinement dictionary, and the stored dictionary.

2. The method of claim 1, in which constructing the plurality of refinement dictionary entries based on the symbols comprises constructing the plurality of refinement dictionary entries for each of a plurality of distinct symbols.

3. The method of claim 1, in which constructing the plurality of refinement dictionary entries based on the symbols comprises:

grouping the symbols into a plurality of clusters based on similarity of the symbols, each individual symbol cluster comprising symbols that are similar; and constructing the plurality of refinement dictionary entries for each of the symbol clusters.

4. The method of claim 1, further comprising:

extracting the plurality of symbols from the subsequent image; and constructing the plurality of refinement dictionary entries for each of a plurality of distinct symbols.

5. The method of claim 1, further comprising:

determining if the plurality of refinement dictionary entries match stored dictionary entries of the stored dictionary, in which, if a match is found for the plurality of refinement dictionary entries in the stored dictionary, then encoding the plurality of refinement dictionary entries using the matching stored dictionary entries as a reference, and in which, if a match is not found for the plurality of refinement dictionary entries in the stored dictionary, then creating a new direct dictionary by encoding the unmatched refinement dictionary entries using the plurality of direct dictionary entries as a reference.

6. The method of claim 1, further comprising:

extracting the plurality of symbols from the subsequent image;

grouping the symbols into a plurality of clusters based on similarity, the symbol clusters each individually comprising symbols that are similar; and constructing the plurality of refinement dictionary entries for each of the symbol clusters.

7. The method of claim 1, further comprising discarding a plurality of least distinct stored dictionary entries within the stored dictionary if the combination of a plurality of bytes for the symbols and a plurality of bytes for the direct dictionary, the refinement dictionary, and the stored dictionary exceeds a threshold.

8. The method of claim 5, in which determining if a plurality of refinement dictionary entries match stored dictionary entries of the stored dictionary comprises using a threshold conditional entropy estimation to determine if one of the plurality of refinement dictionary entries match one of the stored dictionary entries.

9. The method of claim 1, in which a plurality of iterations of hierarchical dictionary creation is dependent on the size in bytes of the combination of a plurality of bytes for the symbols and the number of bytes for the direct dictionary, the refinement dictionary, and the stored dictionary.

10. An image compression system comprising:

a processor; and a memory communicatively coupled to the processor, the memory comprising:

a symbol extraction module to extract a plurality of symbols from a subsequent image in a multi-page binary document;

a dictionary construction module to construct a plurality of refinement dictionary entries based on the symbols, the plurality of refinement dictionary entries forming a refinement dictionary; and a stored dictionary creation module to combine a plurality of refinement dictionaries obtained from a plurality of previous images and a plurality of direct dictionaries obtained from the plurality previous images, the combination forming a stored dictionary, in which the dictionary construction module further constructs a direct dictionary by encoding unmatched refinement dictionary entries using the refinement dictionary;

a dynamic dictionary to update a strategy to discard least distinct stored dictionary entries responsive to a met memory constraint;

a conditional entropy estimation to measure information redundancy between dictionary entries and to retain additional dictionary entries from previous pages in a multi-page document for future use; and a hierarchical dictionary formed from the combination of the refinement dictionary, the direct dictionary, and the stored dictionary.

11. The system of claim 10, in which the processor transmits or stores the hierarchical dictionary with the symbols.

12. The system of claim 10, in which the system is provided as a service over a network.

13. A computer program comprising:

a computer readable storage medium comprising computer usable program code embodied therewith, the computer usable program code comprising:

computer usable program code to, when executed by a processor, extract a plurality of symbols from a first image of a plurality of images within a multi-page document;

computer usable program code to, when executed by a processor, construct a plurality of refinement dictionary entries based on the symbols, the plurality of refinement dictionary entries forming a refinement dictionary;

computer usable program code to, when executed by a processor, group a plurality of refinement dictionary entries into clusters to form a plurality of refinement dictionary entry clusters;

computer usable program code to, when executed by a processor, construct a plurality of direct dictionary entries for each of the plurality of refinement dictionary entry clusters, the plurality of direct dictionary entries forming a direct dictionary and the direct dictionary encoding unmatched refinement dictionary entries using the refinement dictionary;

computer usable program code to, when executed by a processor, construct a stored dictionary by combining the refinement dictionary and the direct dictionary, wherein the refinement dictionary and the direct dictionary are created from a plurality of subsequent images after the first image;

computer usable program code to, when executed by a processor, form a larger dictionary for each page by creating additional dictionary entries for each page within the multi-page document;

computer usable program code to, when executed by a processor, measure information redundancy between the dictionary entries;

computer usable program code to, when executed by a processor, discard a least distinct stored dictionary entry responsive to a met memory constraint; and computer usable program code to, when executed by a processor, form a hierarchical dictionary by combining the direct dictionary, the refinement dictionary, and the stored dictionary.

14. The computer program product of claim 13, further comprising computer usable program code to, when executed by a processor, determine if the plurality of refinement dictionary entries match stored dictionary entries of the stored dictionary;

computer usable program code to, when executed by a processor, encode the plurality of refinement dictionary entries using the matching stored dictionary entries as a reference if a match is found for the plurality of refinement dictionary entries in the stored dictionary; and computer usable program code to, when executed by a processor, create a new direct dictionary by encoding the unmatched refinement dictionary entries using the plurality of direct dictionary entries as a reference if a match is not found for the plurality of refinement dictionary entries in the stored dictionary.

15. The computer program product of claim 13, further comprising computer usable program code to, when executed by a processor, decode the hierarchical dictionary and the symbols to recreate a lossless or lossy version of the first and subsequent images.

\* \* \* \* \*

UNITED STATES PATENT AND TRADEMARK OFFICE
CERTIFICATE OF CORRECTION

PATENT NO. : 10,248,666 B2
APPLICATION NO. : 14/783106
DATED : April 2, 2019
INVENTOR(S) : Depalov et al.

It is certified that error appears in the above-identified patent and that said Letters Patent is hereby corrected as shown below:

On the Title Page

Item (54) and in the Specification, Column 1, Line 1, after "OF" insert --A--.

Signed and Sealed this
Tenth Day of September, 2019

Andrei Iancu
*Director of the United States Patent and Trademark Office*